United States Patent [19]

Laursen et al.

[11] Patent Number: 4,579,406

[45] Date of Patent: Apr. 1, 1986

[54] PRINTED CIRCUIT BOARD CONNECTOR SYSTEM

[75] Inventors: Arthur I. Laursen, Sunnyvale; Samuel F. Wood, Los Altos Hills, both of Calif.

[73] Assignee: D.A.V.I.D. Systems, Inc., Sunnyvale, Calif.

[21] Appl. No.: 690,570

[22] Filed: Jan. 11, 1985

[51] Int. Cl.$^4$ ............................................. H01R 9/09
[52] U.S. Cl. .................................. 339/17 L; 361/409
[58] Field of Search ............ 339/17 L, 17 LM, 17 M; 361/409, 412, 413, 415, 407

[56] References Cited

U.S. PATENT DOCUMENTS

| | | | |
|---|---|---|---|
| 3,993,935 | 11/1976 | Phillips et al. | 339/17 L |
| 4,017,696 | 4/1977 | Falk | 339/17 R |
| 4,079,440 | 3/1978 | Ohnuma et al. | 361/413 |
| 4,241,381 | 12/1980 | Cobaugh et al. | 339/17 M |
| 4,377,315 | 3/1983 | Grau | 339/176 MP |

*Primary Examiner*—Neil Abrams
*Attorney, Agent, or Firm*—Gary T. Aka

[57] ABSTRACT

A system for connecting printed circuit boards to card cages. In addition to a conventional pin-and-socket connector arrangement for making signal and main power connections, the printed circuit board has a conducting pad coupled to the power traces of the board. A clip mounted in the card cage and connected to a first power source isolated from the main power source engages the pad before the conventional connectors make contact. Thus, the board is powered up first. As the board is fully seated and the conventional power and signal connections made, the power clip slides off the pad to break contact, leaving the main power source supplying power to the board.

7 Claims, 8 Drawing Figures

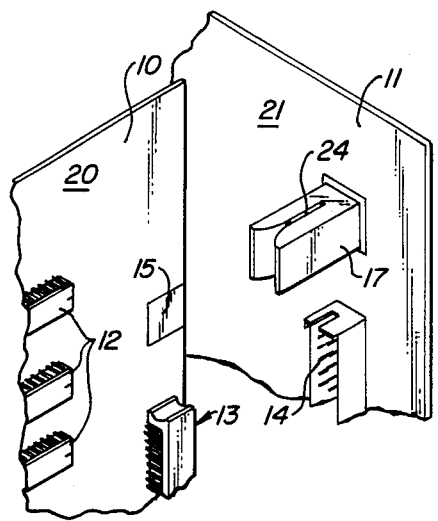
FIG._1A.
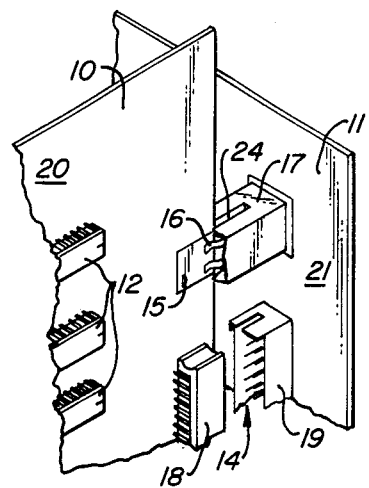
FIG._1B.
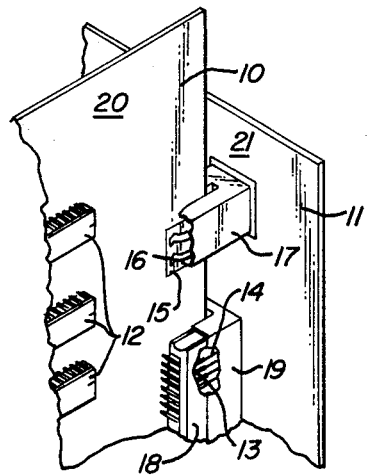
FIG._1C.
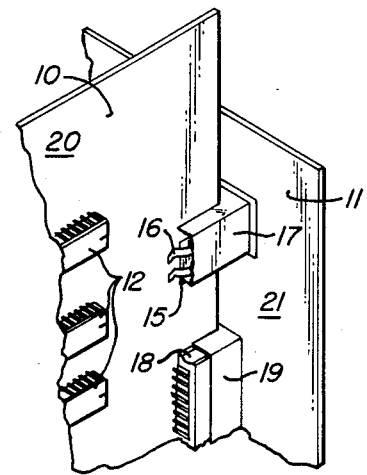
FIG._1D.

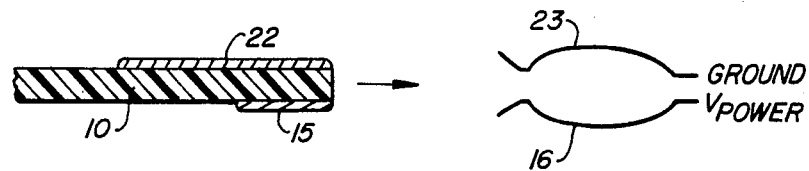
FIG._2A.
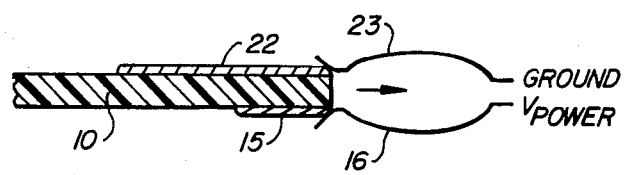
FIG._2B.
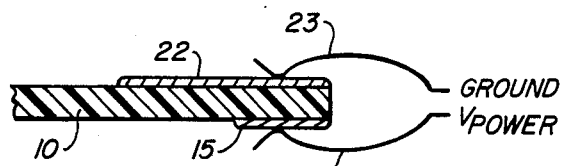
FIG._2C.
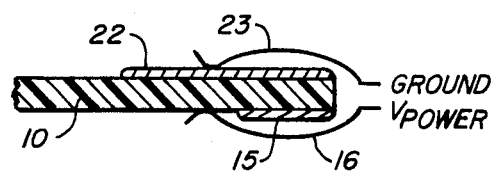
FIG._2D.

PRINTED CIRCUIT BOARD CONNECTOR SYSTEM

BACKGROUND OF THE INVENTION

The present invention relates to the field of connector systems for circuit boards and, more particularly, to a printed circuit board connector system which permits the board to power up before mounting into a structure is complete.

FIELD OF THE INVENTION

Electronic systems are typically made from individual devices, such as hybrid circuits, integrated circuits and individual components, including resistors, capacitors, and inductors. These individual devices are typically mounted on a printed circuit board which has a pattern of conductive traces on the board substrate to electrically couple the devices together in a desired configuration.

Normally, the printed circuit boards are mounted in slots in a mounting structure, such as a card cage. At one edge of the printed circuit board there are connectors which are connected to the wire traces on the printed circuit board. When the printed circuit board is inserted into the card cage, the connectors mate with complementary connectors attached to the card cage in a pin-and-socket configuration. The complementary connectors are wired to a bus, or backplane, of the card cage. Through each line of the bus, the connectors of each board in electrical contact with the wires are connected together in parallel. A line in the bus may supply power to the connected printed circuit boards. A line may also supply a communication path between the boards or between a board and the outside world.

The card cage with its mounted printed circuit boards form an electronic unit, such as a computer. The unit depends upon the design of the circuits on the printed circuit board and their interconnections. In many such units, there is a requirement that the boards be inserted and removed while the electronic unit is operating. Examples of such units include central office switching systems and private branch exchanges (PBXs) in telephone systems. The requirement, however, is not limited to telephone systems.

There are a few major problems, however, which must be surmounted when a board is inserted into or removed from the card cage. The first problem is that the installed board must not affect the operation of the other boards in the system by generating unsynchronized interactions on the backplane or common bus of the system. The second problem is that board insertion and removal must not create electrical conditions which might damage the components on the board. The final problem is that the insertion of the board must not create transient interactions on the common power bus.

The present invention solves or substantially mitigates these problems in an incisive and economical way not contemplated heretofore.

SUMMARY OF THE INVENTION

The present invention provides for a system for electrically connecting a printed circuit board having a plurality of connector contacts at an edge of the printed circuit board to a mounting structure having a plurality of mating connector contacts for engaging the connector contacts when the board is mounted in the mounting structure. The system comprises a conducting pad on the board coupled to electrical devices on the board for supplying power thereto, and a slidable contact on the mounting structure coupled to a first power source. The contact engages the pad before the connector contacts engage the mating connectors as the board is mounted in the structure and disengages when the board is fully mounted in the structure.

The conducting pad is substantially coincident with a surface of the board and the slidable contact comprises a clip which resiliently contacts the board's surface. The clip contacts the pad when the board is placed in a first position for mounting the board into the structure and does not contact the pad when the board is placed in its final mounted position in the structure. The conductor pad is of such shape that the clip loses contact with the pad when the board is seated into the mounting structure.

One of the connector contacts is also coupled to the electrical devices on the printed circuit board for supplying power thereto and its mating connector contact is coupled to a second power source electrically isolated from the first power source.

BRIEF DESCRIPTION OF THE DRAWINGS

FIGS. 1A-1D illustrate how the present invention operates when a printed circuit board is inserted into a mounting structure.

FIGS. 2A-2D show a top view of FIGS. 1A-1D, respectively.

DETAILED DESCRIPTION OF SPECIFIC EMBODIMENTS

Heretofore, attempts to solve the problems above have not been completely successful. To prevent unsynchronized interaction on common signal connectors, a printed circuit board is powered up before its signal connectors make contact with the bus. The powering up stage requires only a fraction of a second typically, but it must occur prior to the signal connector contact. Similarly, if the board is kept powered up as the signal connector contacts are broken, then erroneous signals are not generated on the bus when the board is removed.

A prior art solution to this problem has been multilevel pins so that a power pin and its complementary socket mate before the signal pins do when the printed circuit board is inserted. Moreover, the power pin and socket stay mated as the signal pin contacts are broken when the board is removed.

Another solution in the prior art has a mechanical lever attachment which opens and closes the connections in sequence, somewhat in the fashion of a zipper, so that the power connections are made first and broken last. Still another solution uses an umbilical cord which is manually connected to a special power connector of the printed circuit board before the board is pushed into contact with the main connectors. The umbilical power cord is then manually removed. For board removal, the umbilical cord is attached, the board removed and the cord disconnected.

These solutions also typically solve the second problem. When a printed circuit board is inserted, a ground contact should be made first or coincident with the power contacts. If not, the power contacts with no ground reference may have unintended electrical paths through the printed circuit board. Integrated circuit components are often electrically fragile; the unexpected voltages across device leads may lead to destruction of the component. Therefore, when a printed circuit board is removed, a ground contact should be the last to be broken. The solutions above typically have a ground connector which is one of the first to make or last to break contact upon board insertion or removal respectively.

These solutions solve the first two problems but still do not attack the third problem of the harmful voltage transients caused by the initial surge of current when the board is initially coupled to a power source. After the capacitance of the board is charged, the power supply returns to a stable state. This power source current surge causes voltage fluctuations with potentially serious consequences to the other printed circuit boards already in place and operating.

Two approaches have been used to solve this third problem. The first solution reduced the amount of inrushing transient current into the newly connected board by having an impedance in series with the power connection so that the resulting voltage transient is reduced to a harmless level. This solution has some drawbacks, however. A special component, such as a resistor or inductor, must be mounted on the card. Since this component is in series with the power connection, it limits the current to the printed circuit board so that the board does not receive the full operating voltage to power the printed circuit board. A modification to this approach has been to add more power sequencing levels to the connector so that the card is powered in steps. This just adds extra complexity to the problem.

The other approach has been the use of two power sources which are isolated from one another. The first source powers up the printed circuit board before the board has been fully inserted into the card cage. Though the voltage level of the first power source may fluctuate, it does not affect the operating cards which are being powered by the second or main power source. In the prior art the first power source has been coupled to the printed circuit board by an umbilical cord before insertion into the card cage. After the card was mounted into the card cage, the umbilical cord was removed. While solving two problems discussed above, this system still required effort beyond the straight-forward insertion and removal of the printed circuit board into the mounting structure. The umbilical cord must first be attached and after the card is fully seated, the cord must be removed. The same procedure must be followed to safely remove the board.

The present invention also uses the two separate power sources, which are isolated from one another. The printed circuit board has its normal connecting system, typically a pin-and-socket arrangement at an edge of the board with the mating connectors in the board mounting structure, in the card cage. The connectors at the printed circuit board edge are connected to the wire traces of the board.

The present invention is illustrated in FIGS. 1A–1D of the present invention. The printed circuit board 20 has several electrical components, here shown as multipin integrated circuits 12 which are attached to the board substrate 10. These components 12 are electrically interconnected by wire traces (not shown) on the surface of the board substrate 10. The board 20 and its components 12 are coupled to other printed circuit boards through connectors 13 located at one edge of the board substrate 10. The connectors 13 are sockets which are protected by a socket housing 18. The connectors 13 mate with complementary connectors 14 in the form of pins protected by a housing 19 when the board 20 is connected to a backplane board 21. One or more of the connector sockets 13 is a power connector which has its corresponding complementary connector pin connected to a main power source to drive the components 12. This is a typical arrangement found in electrical systems.

The present invention also has a power pad 15 which is also connected to the power wire traces of the board 20. Corresponding to the power pad 15 is a specially adapted connector 16 which has leads in the form of a clip. The connector clip 16 with its protective housing 17 is mounted to the backplane board substrate 11 in the same manner as the complementary connector contacts 14. The housing 17 has a slot 24 to receive the substrate 10. The clip 16 is longer than the complementary contacts 14 so that it resiliently engages the power pad 15 before the connector contacts 13 mate with the complementary connector contacts 14. FIG. 1B illustrates this relationship.

The clip 16 is coupled to a first power source which is electrically isolated from the main power source coupled to the complementary connector contact 14. Since the power pad 15 first engages the clip connector 16, the first power source first supplies power to the board 20. Even though the first power source may suffer from transient fluctuations, it does not affect the other printed circuit boards since it is electrically isolated from the main power source. As the board 20 is inserted, the connector 13 and complementary connectors 14 mate, as shown in Fig. 1C. At this point the second or main power source is also supplying power to the board 20 through the power connector in the set of connector pins 13.

Finally, as shown in Fig. 1D, the power pad 15 is of such a shape that the clip leads of connector 16 slide off the power pad 15 thus breaking contact when the board substrate 10 is fully seated. Hence the board 20 is now supplied by power through the second power source only.

FIGS. 2A–2D show a top view of the power pad-connector slip connection and correspond respectively to FIGS. 1A–1D. Besides the clip 16, a second clip 23 is shown. The connector clip 16 coupled to the first power source engages the power pad 15 when the board substrate 10 is inserted into a card for mounting. The clip 23 is coupled to ground. A ground pad 22, like the power pad 15, which is nearly coincident with the surface of the substrate 10 engages the clip 23 when the board 20 is inserted.

The pad 22 is coupled to all of the ground terminals of the printed circuit board 20. When the clips 16, 23 respectively resiliently engage the pads 15, 22, a path is made to supply electrical power to the board 20.

Unlike the pad 15, however, the pad 22 need not be shortened in the direction of board travel. Since the pad 22 is a grounded contact, the pad 22 and clip 23 contact may remain even after board mounting is complete and one of the pin-socket 13, 14 connections provides a conventional grounded connection for the board 20.

It should be noted that the main connectors for the printed circuit board connection may also be of the sliding clip-and-pad construction as the power pad and clip previously described. The clips may then be integrated into one housing with a possible savings in manufacturing costs. Of course, the clip lengths, pad sizes and placement must be adjusted to maintain the function of the power pad and complementary clip.

In this manner, the present invention permits the inserted printed circuit board to be powered before the critical signal contacts are coupled into the overall system. Power down under the present invention occurs after the signal contacts are broken. Secondly, a ground contact is made initially for the power up stage to provide a proper reference for all voltages to the board. A ground contact is also assured in the power down stage. Thirdly, the board 20 is first powered up by a first power source which is electrically isolated from the main power source so that transient voltage fluctuations in the initial stages of board mounting do not affect the operations of the electronic system.

Accordingly, while the invention has been particularly shown and described with reference to the preferred embodiments, it would be understood by those skilled in the art that changes in form and details may be made herein without departing from the spirit of the invention. It is therefore intended that an exclusive right be granted the invention as limited only by the metes and bounds of the appended claims.

What is claimed is:

1. A connector system for electrically connecting a printed circuit board having a plurality of connector contacts to a mounting structure having a plurality of mating connector contacts for engaging said circuit board connector contacts, said system comprising
   a conducting pad on said board coupled to electrical devices on said board for supplying power thereto,
   a slidable contact on said mounting structure coupled to a first power source, and
   a mating connector contact for engaging one of said connector contacts, said one connector contact coupled to a second power source electrically isolated from said first power source,
   whereby said board is movable in a first direction with respect to said mounting structure to engage said conducting pad with said slidable contact supplying power to said board from said first power source, then to engage said power connector contact with said mating connector contact and to disengage said conducting pad and slidable contact while said power connector contact and mating connector contact remain engaged supplying power to said board from said second power source.

2. The connector system of claim 1 wherein said conducting pad is substantially coincident with a surface of said board and said slidable contact comprises a clip resiliently contacting said board surface, said clip contacting said pad when said board is placed in a first position for mounting in said structure and breaking contact with said pad when said board is moved into a second position in said first direction.

3. The connector system of claim 2 wherein said conducting pad extends along said board surface only to the extent that said clip contact slides past said pad when said board is in said second position in said structure.

4. A system for electrically connecting a printed circuit board to a card cage, comprising
   a plurality of conductor contacts, including a power contact, at an edge of said printed circuit board for engaging a plurality of complementary connector contacts in said card cage,
   an electrically conductive pad near said edge of said board forming part of a major surface of said board, said pad coupled into said board's power system,
   a slidable contact in said card cage for resiliently contacting said major surface of said board as said board is inserted into said card cage, said contact coupled to a first power source and extending beyond said complementary connector contacts to contact said pad to supply power to said board in a first position with respect to said card cage in which said circuit board connector contacts do not engage said complementary connector contacts, and
   one of said complementary connector contacts for engaging said power contact coupled to a second power source to power said board, said first and second power sources electrically isolated from one another, said complementary connector contacts engaging said connector contacts in a second board position with respect to said card cage in which said slidable contact breaks contact with said pad.

5. The system of claim 4 wherein said conductive pad is of such shape that said slidable contact loses contact with said pad when said board moved from said first position to said second position with respect to said card cage.

6. The system of claim 5 wherein said connector contacts and said complementary connector contacts comprise pin-and-socket contacts.

7. The system of claim 5 wherein said connector contacts and said complementary connector contacts comprise pad-and-sliding clip contacts.

* * * * *